(12) United States Patent
Arai et al.

(10) Patent No.: US 7,821,199 B2
(45) Date of Patent: Oct. 26, 2010

(54) ORGANIC ELECTROLUMINESCENT DEVICE AND MANUFACTURING METHOD THEREOF

(75) Inventors: Takeshi Arai, Otsu (JP); Shigeo Fujimori, Cupertino, CA (US); Takeshi Ikeda, Amagasaki (JP)

(73) Assignee: Toray Industries, Inc., Tokyo (JP)

( * ) Notice: Subject to any disclaimer, the term of this patent is extended or adjusted under 35 U.S.C. 154(b) by 759 days.

(21) Appl. No.: 11/661,698

(22) PCT Filed: Sep. 8, 2004

(86) PCT No.: PCT/JP2004/013021
§ 371 (c)(1),
(2), (4) Date: Mar. 2, 2007

(87) PCT Pub. No.: WO2006/027830
PCT Pub. Date: Mar. 16, 2006

(65) Prior Publication Data
US 2008/0018236 A1 Jan. 24, 2008

(51) Int. Cl.
H01J 1/62 (2006.01)
H01J 63/04 (2006.01)
(52) U.S. Cl. .................. 313/506; 313/498; 313/504
(58) Field of Classification Search ......... 313/498–512; 445/24–25
See application file for complete search history.

(56) References Cited

U.S. PATENT DOCUMENTS

| | | | |
|---|---|---|---|
| 2003/0137557 A1* | 7/2003 | Nakamura | ............... 347/44 |
| 2004/0020435 A1 | 2/2004 | Tsuchiya et al. | |
| 2004/0104197 A1 | 6/2004 | Shigemura et al. | |
| 2004/0144317 A1 | 7/2004 | Chuman et al. | |
| 2005/0042320 A1* | 2/2005 | Hasei | ............... 425/375 |

FOREIGN PATENT DOCUMENTS

| | | |
|---|---|---|
| CN | 1480011 | 3/2004 |
| CN | 1510971 | 7/2004 |
| EP | 1 426 461 | 6/2004 |
| JP | 2000-12238 | 1/2000 |
| JP | 2000-160323 | 6/2000 |
| JP | 2002-022924 | 1/2002 |
| JP | 2002-060927 | 2/2002 |
| JP | 2003-068454 | 3/2003 |
| JP | 2003-152114 | 5/2003 |
| JP | 2004-185832 | 7/2004 |
| JP | 2004-296436 | 10/2004 |
| WO | WO 99/54786 | 10/1999 |

OTHER PUBLICATIONS

EP Search Report mailed on Mar. 16, 2010 directed at application No. 04787704: 3 pages.

* cited by examiner

*Primary Examiner*—Joseph L Williams
*Assistant Examiner*—Kevin Quarterman
(74) *Attorney, Agent, or Firm*—Morrison & Foerster LLP

(57) ABSTRACT

A highly fine organic electroluminescent device is provided. A method for manufacturing the organic electroluminescent device is provided for patterning a very fine light emitting layer, and a deposition mask is provided to be used in the patterning. For deposition of the light emitting layer, a mask member is provided with apertures (effective apertures) for forming the light emitting layer to be used for light emitting pixel and apertures (dummy apertures) not to be used for forming the light emitting pixel around an area (effective aperture area) separated by the outer edge of a group of the apertures. The light emitting layer is deposited by using the deposition mask.

8 Claims, 12 Drawing Sheets

(b)

(a)

(a)

(b)

(c)

ORGANIC ELECTROLUMINESCENT DEVICE AND MANUFACTURING METHOD THEREOF

REFERENCE TO RELATED APPLICATIONS

This is a national stage application under 35 USC 371 of International Application No. PCT/JP2004/013021, filed Sep. 8, 2004.

TECHNICAL FIELD

The present invention relates to an organic electroluminescent device including a luminescent layer composed of organic compounds and formed as a pixel pattern by a mask deposition method, and also relates to a manufacturing method thereof.

BACKGROUND ART

An organic electroluminescent device emits light when the positive holes injected from an anode and the electrons injected from a cathode are recombined in an organic luminescent layer kept between both the electrodes. As a typical structure of it, as shown in FIG. 2, first electrodes 2 formed on a substrate 1, thin film layers including at least a luminescent layer 5 composed of organic compounds, and second electrodes 6 are formed on it, and the light emitted by such recombination goes out through the transparent electrodes to outside. Such an organic electroluminescent device is thin and allows high-brightness light emission at a low driving voltage or multi-color light emission by selecting the organic compounds of the luminescent layer, being applied as a luminescent device or display, etc.

Manufacturing an organic electroluminescent device, it is necessary to form a pattern of the luminescent layer, etc., and various manufacturing methods have been studied. In the case where fine patterning is required, photolithography is used as a typical method. For forming the first electrodes of the organic electroluminescent device, photolithography can be applied, but for forming the luminescent layer and the second electrodes, it is often difficult to apply photolithography, since photolithography basically has problems owing to a wet process. Therefore, for forming the luminescent layer and the second electrodes, a dry process such as vacuum deposition, sputtering, or chemical vapor deposition (CVD) is applied. Among these processes, as a means for patterning a thin film, a mask deposition method using a deposition mask is often applied.

The pattern of the luminescent layer of an organic electroluminescent device used as a display has a very high preciseness. In a passive matrix system, the luminescent layer is formed on the first electrodes patterned as stripes, and the line width of the first electrodes is usually 100 μm or less, while the pitch of the first electrodes is about 100 μm. The second electrodes are also formed as stripes to cross the first electrodes at a pitch of hundreds of micrometers, and the slender electrodes must have a low electric resistance in the lengthwise direction while the electrodes adjacent to each other in the crosswise direction must be perfectly insulated from each other. Also in an active matrix system, the luminescent layer is patterned at an equivalent or higher precision.

Therefore, the deposition mask used for patterning the luminescent layer is also inevitably required to have a high precision. The methods for manufacturing a mask member include etching, mechanical grinding, sand blasting, sintering, laser processing, use of a photosensitive resin, etc. Etching and electrocasting are often used, since they are excellent in the precision of fine patterning.

Further, if the mask member is thick, shadowing due to the deposition angle occurs and makes the pattern blunt. So, if a higher precision is required, the thickness of the mask member must be thinner. The thickness of the mask member for the luminescent layer is usually as thin as 100 μm or less, and it is generally fixed and held on a frame like a window frame when it is used in a deposition step.

The mask member of the deposition mask used for forming the luminescent layer has a mask area 7 and an opening area 9 demarcated by the outer edges of the openings 10 arranged for patterning (FIG. 3). This mask has a problem that an in-plane stress difference occurs between the mask area and the opening area depending on mask manufacturing conditions, and that local bending occurs at the boundary portion {the dotted line portion of FIG. 3 (a)}. If such a deposition mask is used, the closeness between the substrate and the deposition mask is impaired at the bent boundary portion between the mask area and the opening area, to blur the luminescent layer pattern for example. Especially in the case where the pitch of pixel sets, each set consisting of one each luminescent pixel of respective colors, is 500 μm or less, the colors of adjacent luminescent pixels are likely to be mixed, not allowing fine light emission to be obtained. This problem is more likely to occur for exerting larger influence when the boundaries are straight and longer, because of the nature of bending at the boundary portion between the mask area and the opening area. That is, this problem is more outstanding when the screen is larger-sized with longer sides.

To address the problem, known are a technique in which a tensioned mask member is fixed for the purpose of inhibiting its warping and bending and a technique as shown in FIG. 4 in which reinforcing wires 11 are partially introduced for the purpose of maintaining a patterning precision (for example, see Patent Document 1). However, these techniques are not able to inhibit local bending. Further, as the deposition mask for forming the second electrodes in conformity with a predetermined pattern, disclosed is a means for lessening the applied tension by dividing the mask member (for example, see Patent Document 2), but this technique is considered to be insufficient for higher precise patterning of the luminescent layer. Meanwhile, the positions at which said reinforcing wires are introduced are the positions overlying on the insulation layer, to avoid the influence on light emission. For this reason, in the case where a deposition mask with reinforcing wires is used, if the luminescent layer pattern has, for example, stripes in the lengthwise direction with respective colors arranged alternately in the crosswise direction, the pitch of the reinforcing wires in the lengthwise direction is identical with the pitch of luminescent pixels at the smallest or integer times the pitch, and the pitch in the crosswise direction is integer times the pitch of luminescent pixels.

Further, as a multiple luminescent area deposition mask, it is also known that if the mask member is stuck to a frame with n openings, productivity can be enhanced (for example, see Patent Document 3), but this technique is not effective for inhibiting the local bending of the mask member.

Known is another multiple luminescent area deposition mask in which a striped first mask member and a second mask member for defining the deposition range are overlaid on each other (for example, see Patent Document 4), but the technique cannot solve the problem addressed by this invention of to achieve no impact of the local bending of the mask member on the luminescent area. Moreover, since it is necessary to align the two mask members, i.e., the striped first mask member and the second mask member to the object for deposition, the technique is disadvantageous in view of productivity. Furthermore, the second mask member may cause shadowing and raise the risk of producing defective products.

[Patent Document 1] JP2000-160323A
[Patent Document 2] JP2000-12238A
[Patent Document 3] JP2003-152114A
[Patent Document 4] JP2003-68454A

SUMMARY OF THE INVENTION

The object of this invention is to provide a method for producing an organic electroluminescent device having highly precision over the entire surface of the luminescent area by forming a luminescent layer so as to prevent impact of the bending of the mask member on the luminescent pixel portion.

To solve the aforesaid problem, this invention has the following constitution.

A. A deposition mask used for depositing a luminescent layer of an organic electroluminescent device, comprising a mask member having openings for forming the luminescent layer used as luminescent pixels (hereinafter the openings are called the effective openings) and openings not used for forming the luminescent pixels and positioned around the area demarcated by the outer edges of the group of said effective openings (hereinafter the openings are called the dummy openings) (hereinafter the area is called the effective opening area).

B. A method for manufacturing an organic electroluminescent device having luminescent pixels of two or more colors, comprising the steps of placing the deposition mask as set forth in said A or the deposition mask obtained by improving said deposition mask in contact with or near the object for deposition for pixels of at least one color, and depositing the luminescent organic compound through said mask, for forming a luminescent layer.

C. An organic electroluminescent device in which thin layers including a luminescent layer composed of organic compounds are kept between first electrodes and second electrodes, as luminescent pixels of two or more colors disposed at a predetermined pitch over a substrate, characterized in that said luminescent layer has a striped pattern; the luminescent pixels are disposed in such a manner that respective colors are disposed alternately in one direction and that only any one of the colors is disposed in the direction perpendicular to said one direction; and one or more dummy pixels composed of the same organic compounds as those used for forming said luminescent layer, which is not used as luminescent pixels, are formed in other than the area having said luminescent, pixels disposed (hereinafter the area called the luminescent area).

This invention can provide an organic electroluminescent device with good display quality, in which a highly precise pattern of a luminescent layer can be formed in the entire area.

DETAILED DESCRIPTION OF THE INVENTION

The organic electroluminescent device of this invention is only required to be an organic electroluminescent device having luminescent pixels of two or more colors disposed at a predetermined pitch, and can be either of a passive matrix type or of an active matrix type, being not limited in display mode. Especially a display with luminescent pixels having luminescent peak wavelengths existing in the red, green and blue regions respectively is called a full color display. Usually the light peak wavelength of the red region is in a range from 560 to 700 nm, that of the green region, from 500 to 560 nm, and that of the blue region, from 420 to 500 nm.

The range called luminescent pixels is a portion where luminescence occurs when the electric power is supplied. That is, it is a portion where both the first electrodes and the second electrodes face each other when viewed in the thickness direction, or a range defined by the insulation layer if the insulation layer is formed on the first electrodes. In a passive matrix display, the first electrodes and the second electrodes are formed as stripes, and their intersections are used as luminescent pixels. So, the shape of each luminescent pixel is often rectangular. In an active matrix display, switching means may be formed near the luminescent pixels, and in this case, the shape of each luminescent pixel is not rectangular but is often formed as partially cutaway rectangle. However, in this invention, the shape of each luminescent pixel is not limited to these shapes, and can also be circular for example, or can have any desired shape by controlling the form of the insulation layer, etc.

Figure 1:
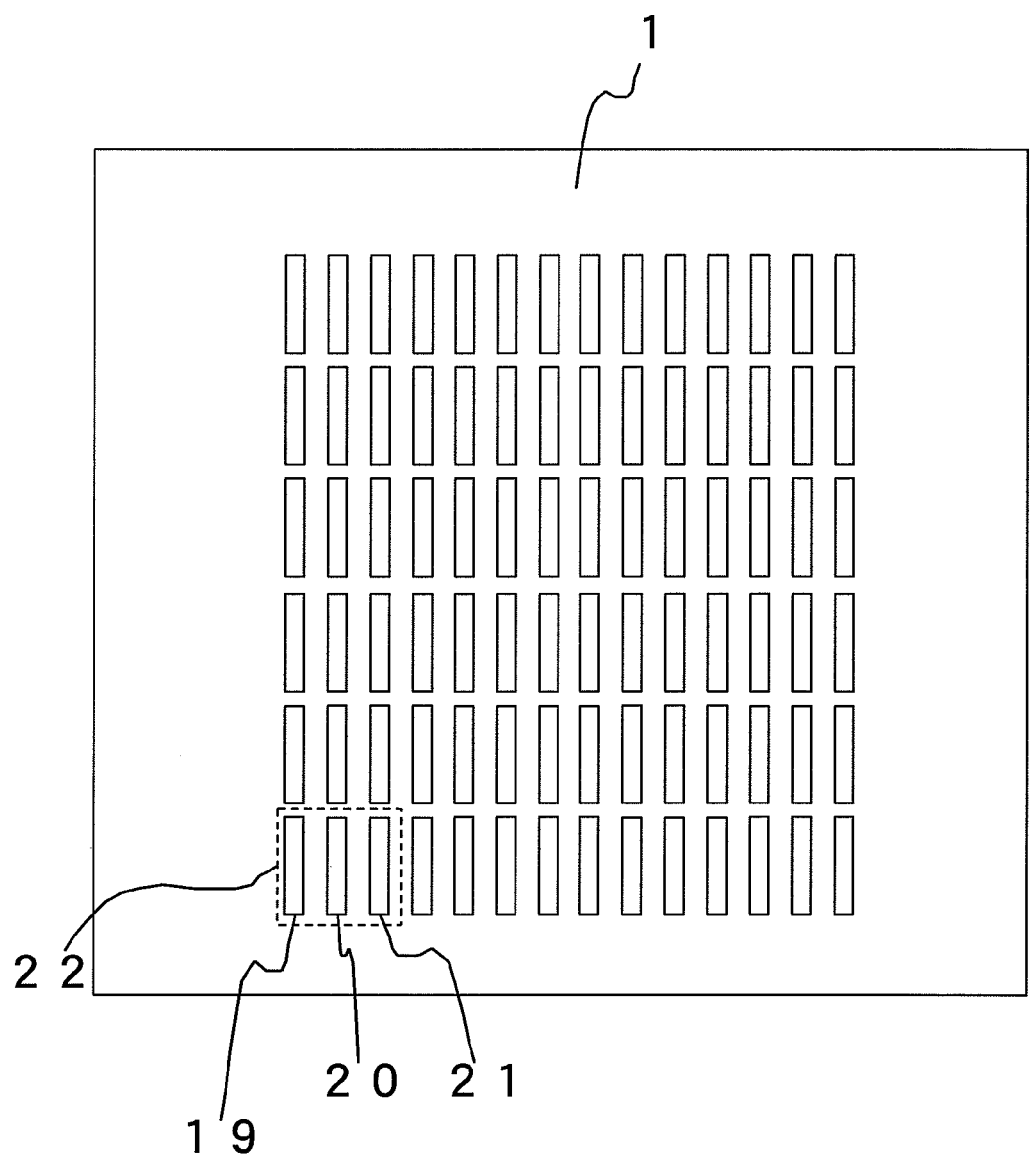
FIG. 1 is a plan view showing an example of pixel sets.
Figure 2:
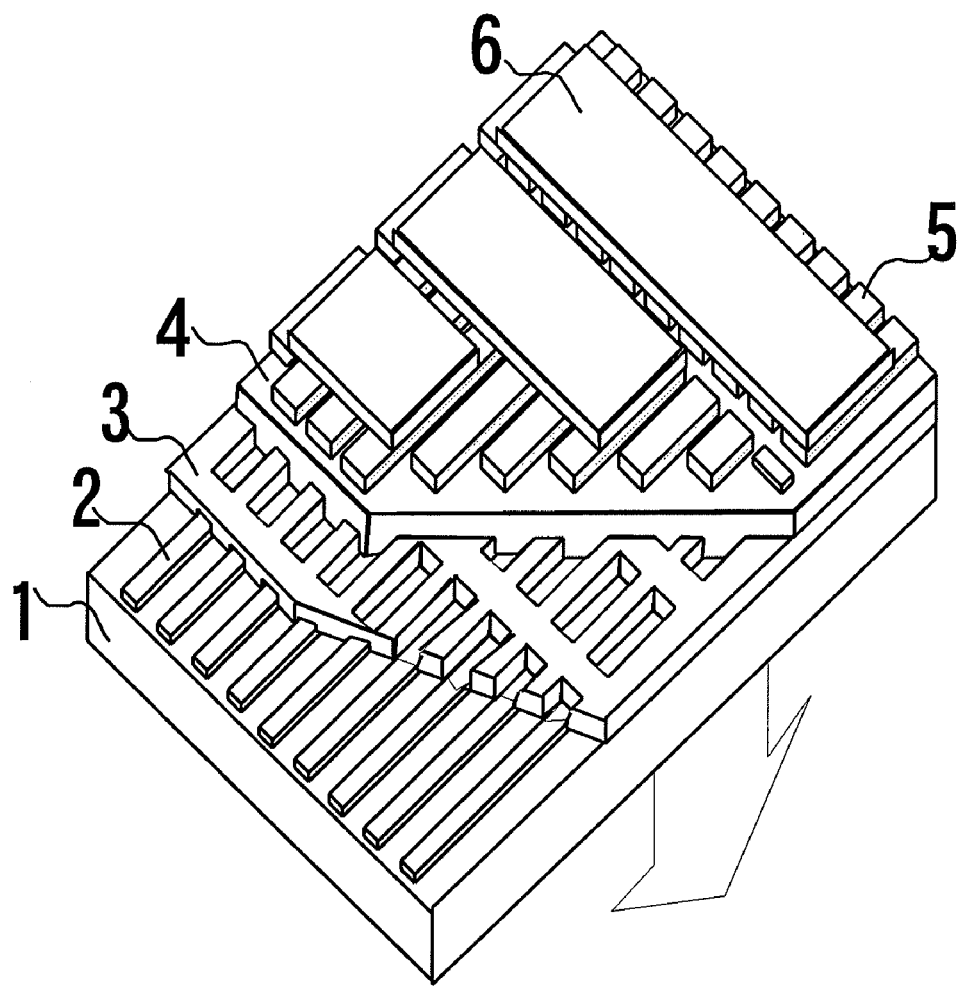
FIG. 2 is a partially cutaway schematic perspective view explaining an example of the structure of the organic electroluminescent device.
Figure 3:
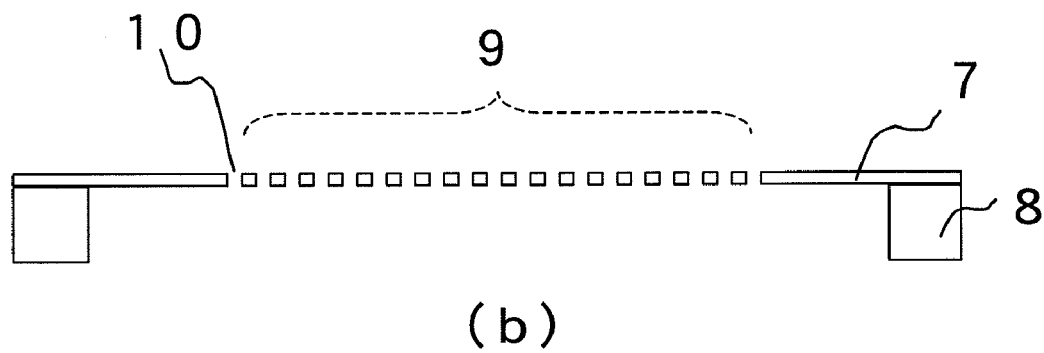
FIGS. 3(a) and 3(b) are schematic drawings showing an example of a plan view and a sectional view of the deposition mask, respectively.
Figure 3:
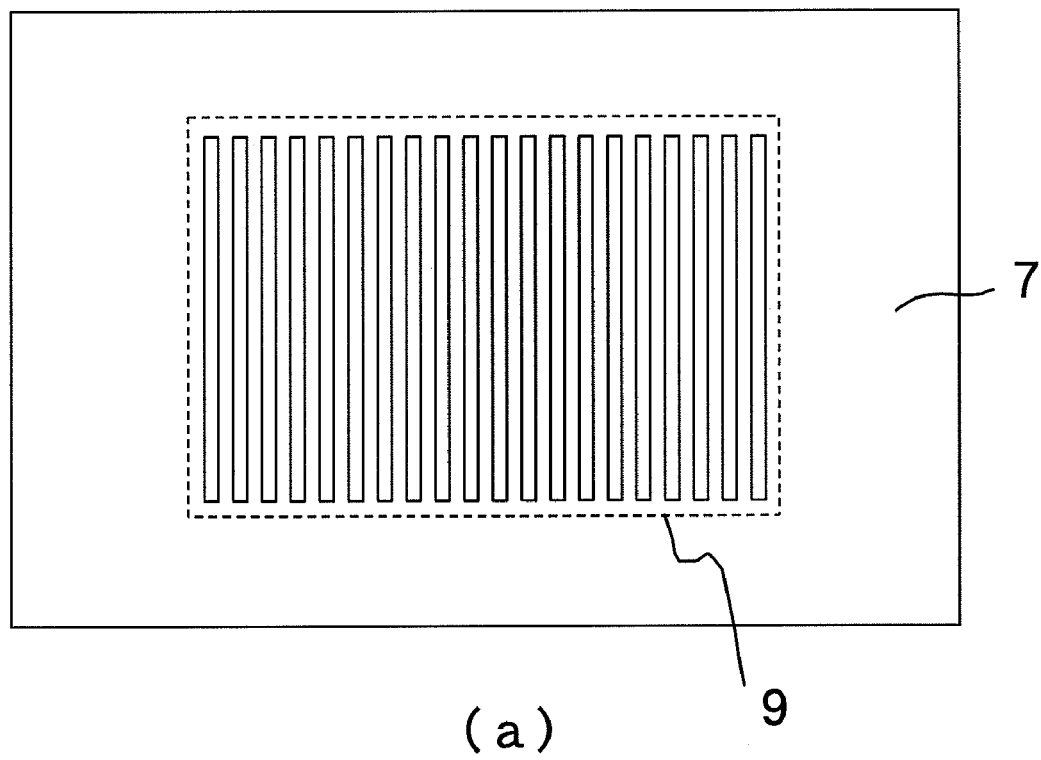
Figure 4:
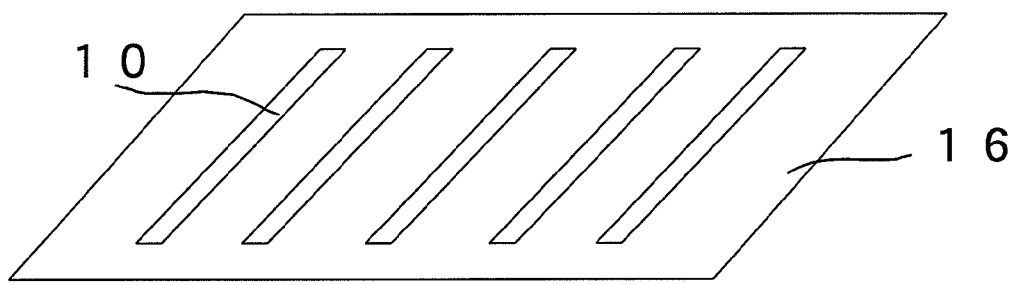
FIGS. 4(a), 4(b) and 4(c) are schematic perspective views showing an example of the deposition mask not having any reinforcing wire, an example of the deposition mask having reinforcing wires, and another example of the deposition mask having reinforcing wires, respectively.
Figure 4:
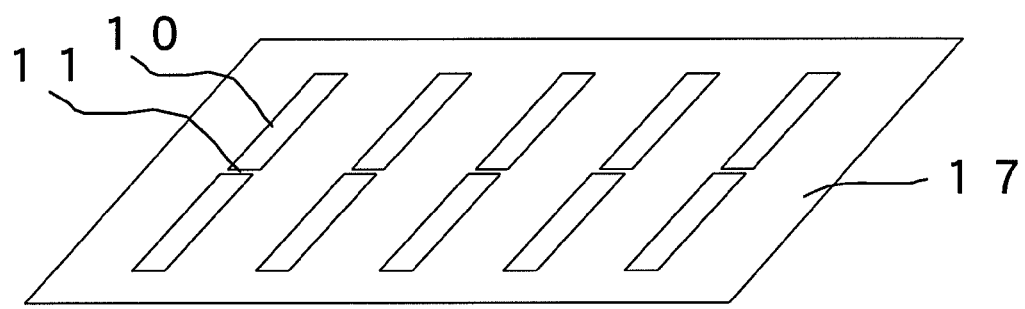
Figure 4:
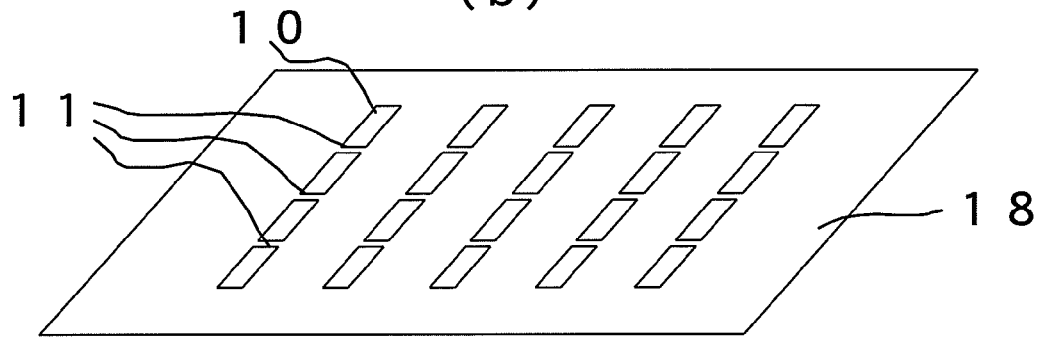
Figure 5:
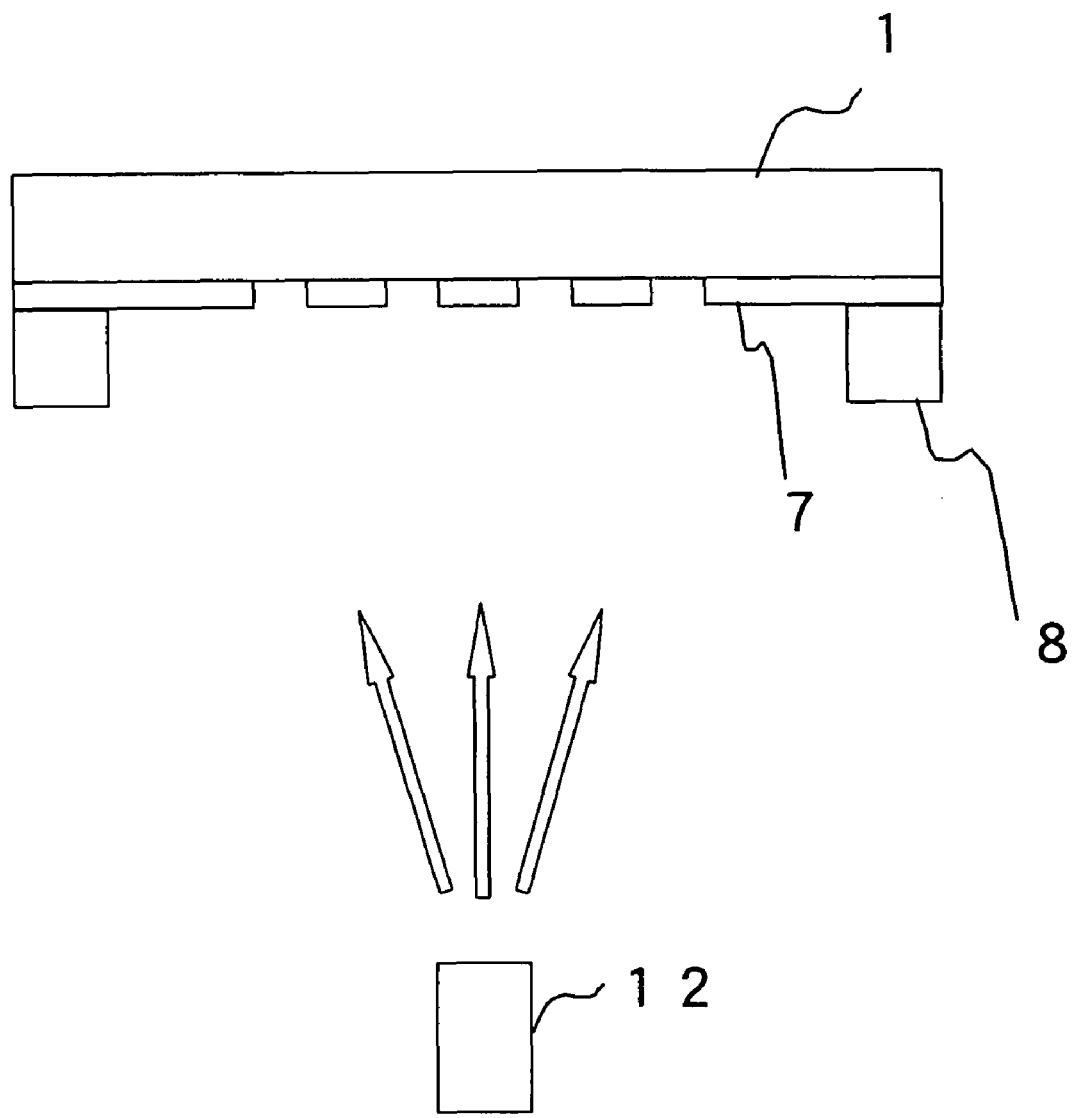
FIG. 5 is a typical view for explaining a mask deposition method.

For the organic electroluminescent device of this invention, the luminescent layer is formed by a mask deposition method. The mask deposition method refers to a method in which the deposition mask is placed in contact with or near the object for deposition for patterning the luminescent organic compounds, as shown in FIG. 5. The deposition mask with openings in a desired pattern is placed on the deposition source side of the substrate, and vapor deposition is per-formed. To obtain a highly precise deposition pattern, it is important to keep a highly flat deposition mask in contact with the substrate, and a technique of tensioning the mask member or a method of keeping the deposition mask in contact with the substrate by a magnet installed on the rear side of the substrate, etc. is applied.

The deposition mask for the luminescent layer used in the manufacturing method of this invention is described below. Since the luminescent layer pattern is required to have high precision, the deposition mask used in this invention is also inevitably required to have high precision. The methods for manufacturing a mask member include etching, mechanical grinding, sand blasting, sintering, laser processing, use of a photosensitive resin, etc. Etching and electrocasting are often used, since they are excellent in precision of fine patterning. It is preferred that the thickness of the mask member is 100 μm or less.

Figure 8:
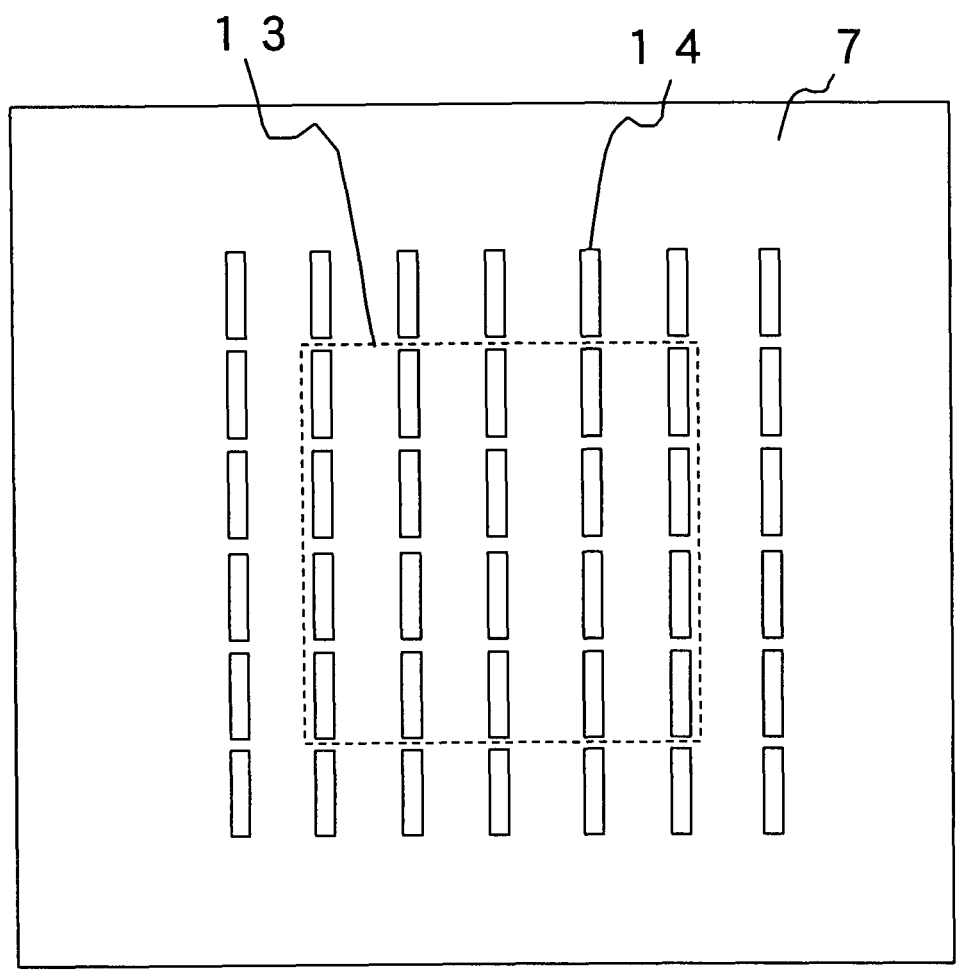
FIG. 8 is a plan view showing an example of the deposition mask having dummy openings.

The mask member of the deposition mask used in the manufacturing method of this invention has characteristically the effective openings used for forming the luminescent pixels and the dummy openings not used for forming the luminescent pixels and positioned around the effective opening area demarcated by the outer edges of said effective openings (FIG. 8). Further, in an embodiment of the organic electroluminescent device obtained by the manufacturing method of this invention, non-luminescent dummy pixels composed of the same organic compounds as those used for forming said luminescent layer are formed in the portion around the luminescent area. If a deposition mask having such a mask member is used, the bending due to the stress difference, etc. in the mask member does not affect the effective opening area existing inside the area of the dummy openings. So, the effective opening area can be precisely kept in contact with the member to be deposited with the organic compounds, and a luminescent layer with a highly precise pattern can be obtained.

Meanwhile, the effective opening area can also be defined as an area demarcated by the shortest closing line in contact with the outermost effective openings and comprising such outermost effective openings.

Figure 9:
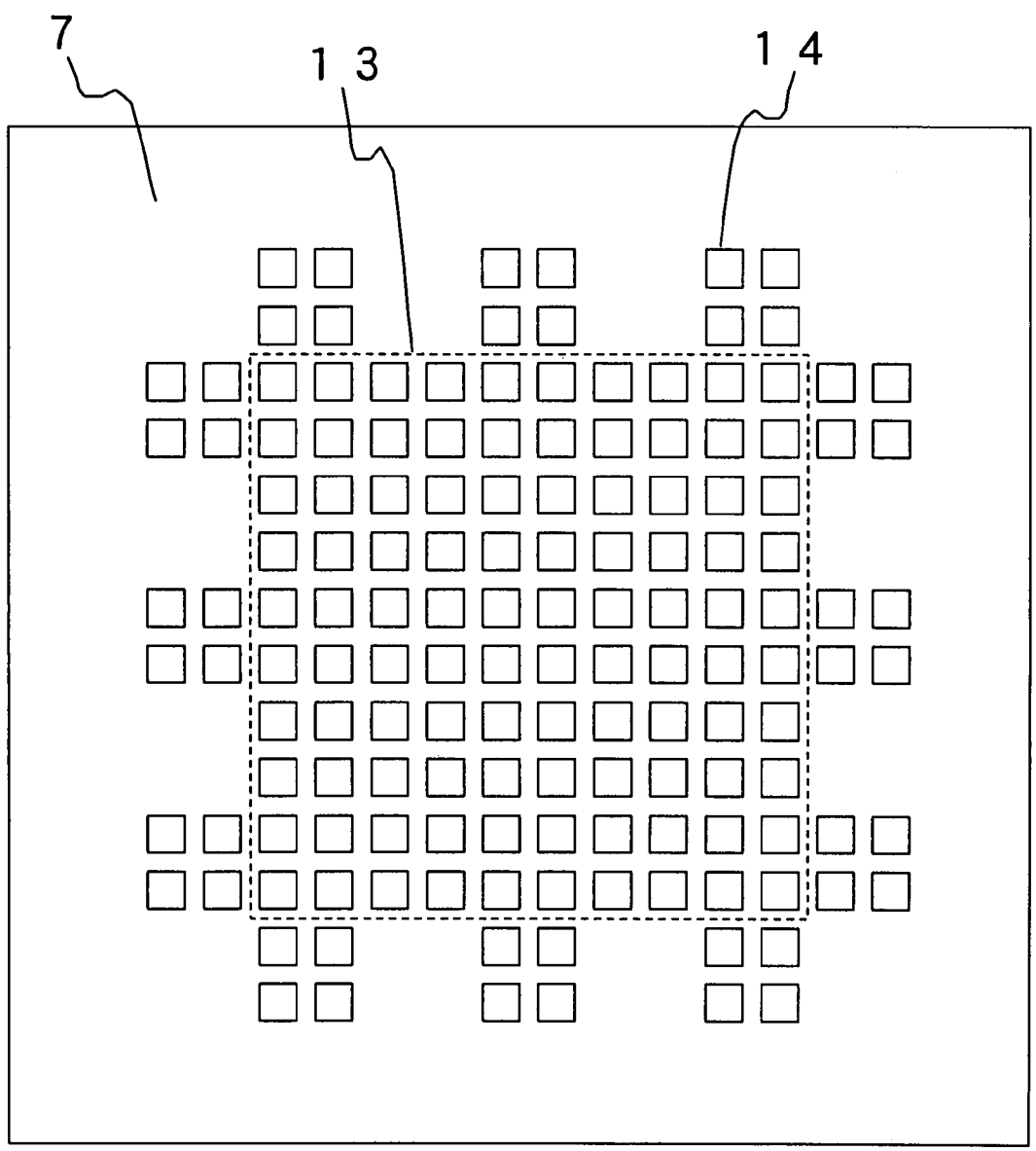
FIG. 9 is a plan view showing an example of the deposition mask in which dummy openings are disposed around the effective opening area to ensure that the outermost peripheral portion of the opening area (including the effective openings and the dummy openings) does not have a straight portion of 10 mm or more.

Further, as a preferred method for obtaining the effect of this invention sufficiently, it is preferred that dummy openings are arranged around the effective opening area to ensure that the outermost peripheral portion of the opening area (including the effective openings and the dummy openings) does not have a straight portion of 10 mm or more (see FIG. 9). In this case, the local bending can be effectively spread.

The number, shape and size of dummy openings are not especially limited. The number of dummy openings can be one or more. It is preferred that one or more dummy openings are respectively positioned outside the four sides of the effective opening area, and it is more preferred that three or more dummy openings are respectively positioned outside the four sides. The shape of dummy openings can be rectangular or circular. Further, the size of each dummy opening can also be larger or smaller than that of each effective opening. The dummy openings and the effective opening can be formed independently from each other in shape, but it is preferred that the dummy openings are formed to comply with the pattern of effective openings, since it is easy to manufacture the mask member in this case. If effective openings are arranged in m in the lengthwise direction and n in the crosswise direction at predetermined pitch, it is preferred that the numbers of all the openings are m+1 or more in the lengthwise direction and/or n+1 or more in the crosswise direction, that is, it is preferred that the openings other than m×n openings are used as dummy openings.

In this invention, plural mask members can be used, and it is only required that one of the mask members is a mask member having said dummy openings. In the case where plural mask members are used, the respective mask members can be kept away from each other or can be kept in contact with each other.

The mask member is usually tensioned and fixed to a frame, since this is simple to handle. The mask member per se may also be used as the deposition mask as the case may be. If the frame is used, the form is not especially limited, and various modes can be considered.

Figure 6:
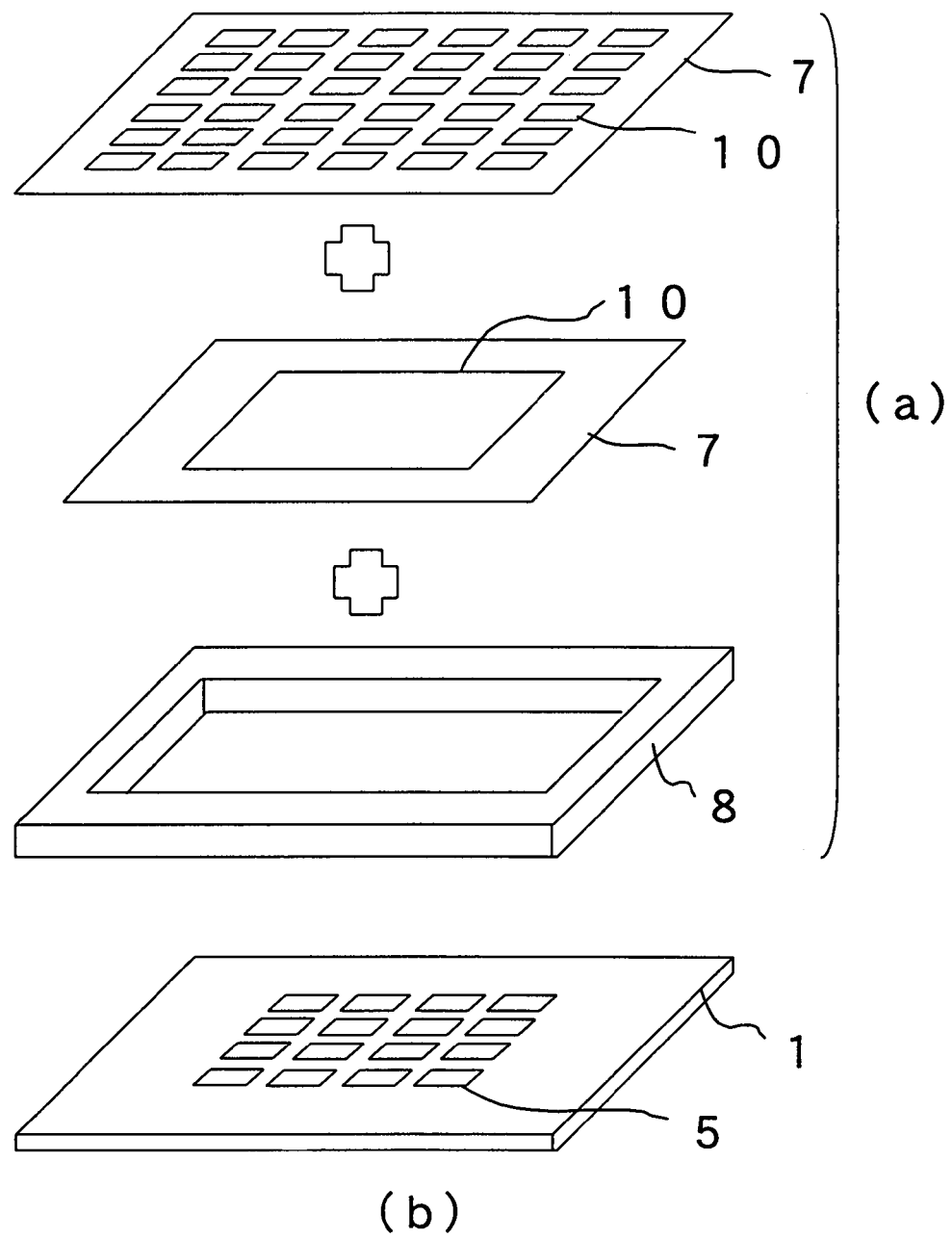
FIGS. 6(a) and 6(b) are typical drawings showing a combination deposition mask (single luminescent area deposition mask) and its deposition pattern, respectively.

Particular examples will be described below in reference to drawings. As shown in FIG. 6, a mask member (upper mask member) having a desired pattern of openings corresponding to luminescent pixels in almost the entire surface of the portion other than the margin used for fixing to the frame (hereinafter the portion is called the deposition mask utilization area) and a mask member (lower mask member) having an opening larger than the luminescent area are overlaid on each other to obtain the deposition mask of this invention in which the upper mask member has the effective openings not masked by the lower mask member and the dummy openings masked by the lower mask member. In this case, the lower mask member partially or perfectly covers some or all of the dummy openings. In this constitution, it is not necessary to bond the two mask members to each other, and they can be merely overlaid on each other or even are able to be kept in contact with each other. Further, if any of these methods is used, the upper mask member can have openings uniformly in the entire surface. For this reason, the upper mask is likely free from in-plane stress difference, strain, etc., and the precision of fixing to the frame and the precision of patterning by deposition can be enhanced. Meanwhile, for deposition of the luminescent layer, the upper mask is installed on the side of the object for deposition. It is preferred that the upper mask member is kept in contact with the object for deposition.

In this case, it is preferred that one edge of the opening of the lower mask member is positioned outside the area surrounded by the dummy openings of the upper mask member and inside the area surrounded by a line drawn at a distance of 500 μm from the outer edge of the effective opening area. In this constitution, the pattern deposited through the dummy openings is not formed or exist only in the slight portion outside the effective opening area (it is preferred that such pattern is formed within the area surrounded by a line drawn at a distance of 500 μm from the outer edges of the luminescent area in the organic electroluminescent device). In this case, the cause of dusting in the post-processing or the cause of defective adhesion in wiring, etc. can be eliminated to assure good post-processing. Further, the shadowing caused by the thickness of the lower mask member can be decreased or eliminated.

Meanwhile, the area surrounded by the dummy openings refers to an area demarcated by the shortest closing line in contact with the dummy openings adjacent to the effective opening area and not containing said dummy openings. (However, in the case where no dummy openings exist at the corners of the effective opening area, it should be virtually assumed that the dummy openings nearest to the corners exist at the corners with the same distance kept against the effective opening area.)

Figure 7:
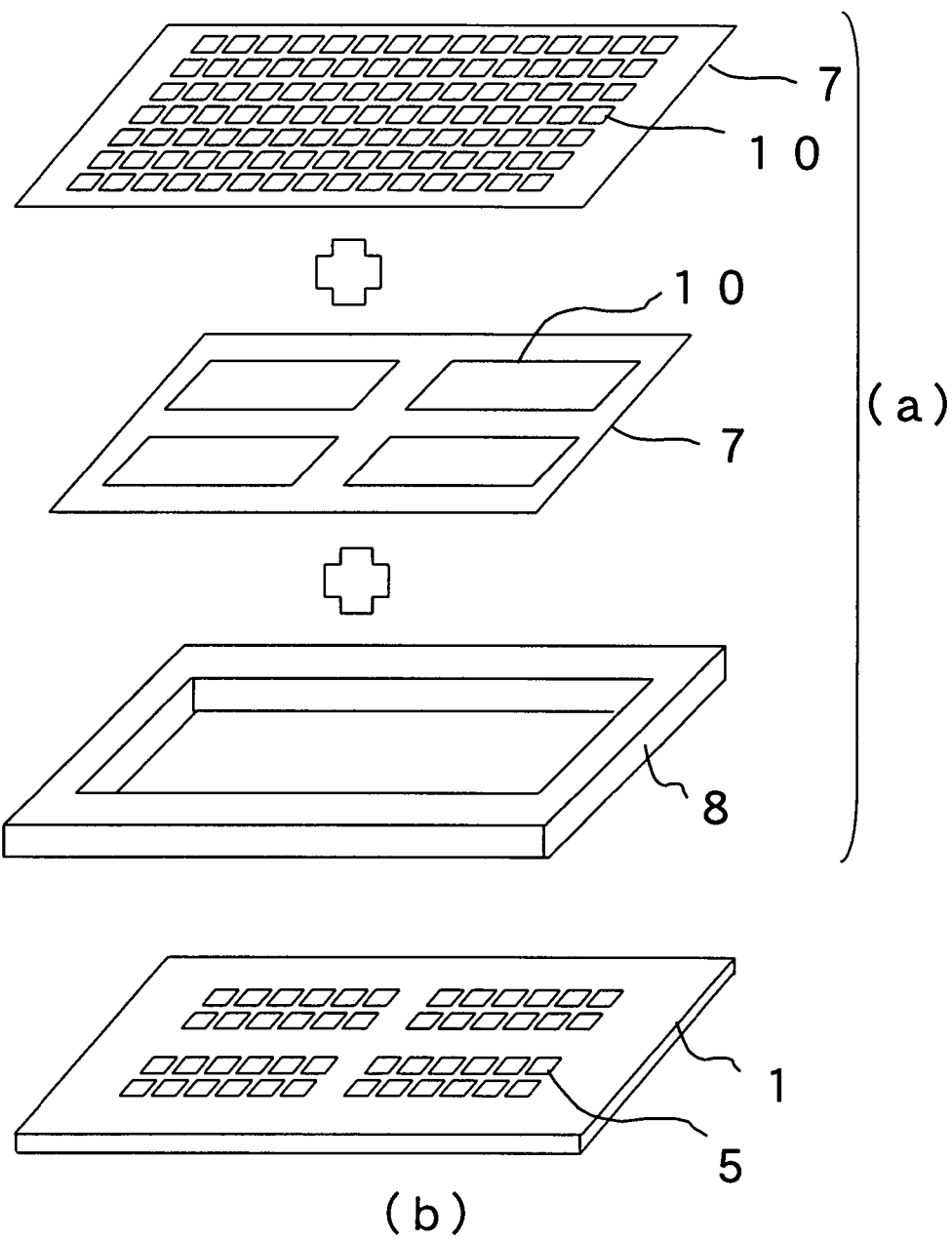
FIGS. 7(a) and 7(b) are typical drawings showing a combination deposition mask (quadruple luminescent area deposition mask) and its deposition pattern, respectively.
Figure 11:
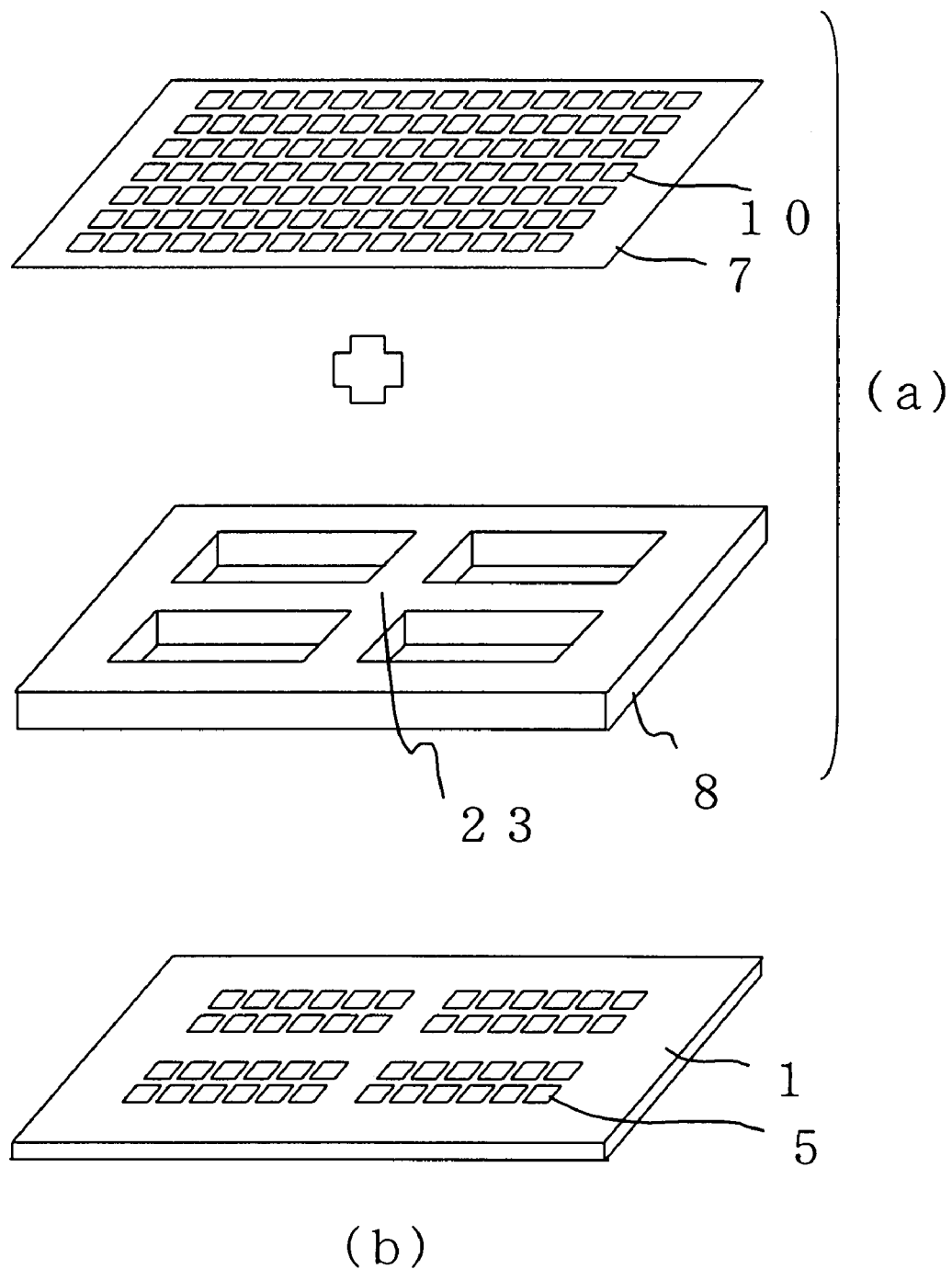
FIGS. 11(a) and 11(b) are typical drawings showing a deposition mask with bars added to a frame (the bars and the deposition mask are bonded to each other) and its deposition pattern, respectively.
Figure 12:
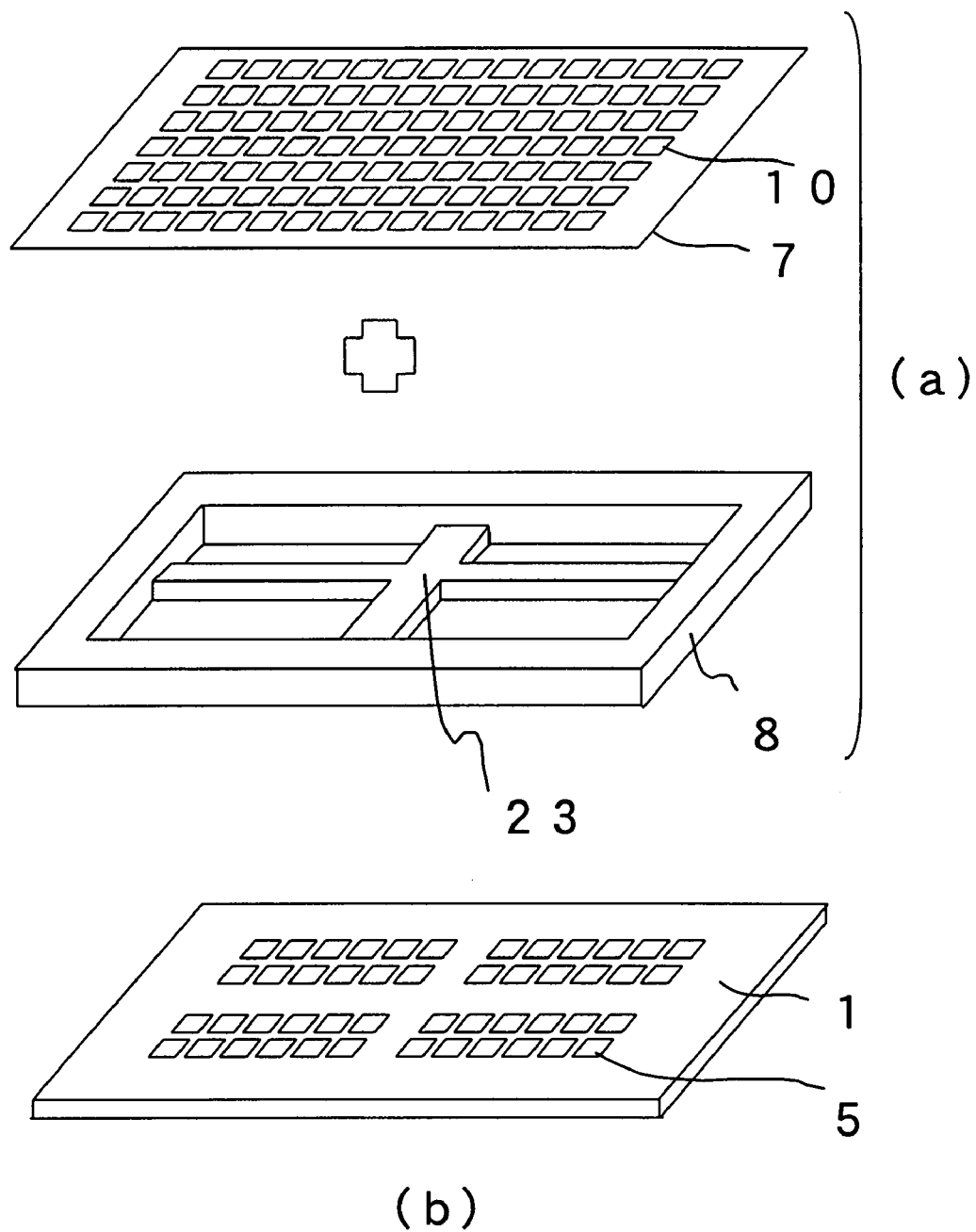
FIGS. 12(a) and 12(b) are typical drawings showing a deposition mask with bars added to a frame (the bars and the deposition mask are not bonded to each other) and its deposition pattern, respectively.

Further, if these methods are used, a multiple luminescent area deposition mask as shown in FIG. 7 or 11 can also be easily prepared. Furthermore, in the case where the mask member is combined with the frame as shown in FIG. 12, it is not necessarily required to fix the mask member to the bars of the frame.

In the examples of FIGS. 6 and 7, both the mask members overlaid on each other can be fixed to the frame, but for more highly precise patterning, it is preferred, for example, that the finely patterned upper mask member facing the substrate is fixed on the upper surface of the frame while the lower mask member defining the deposition area is fixed inside the frame, so that no unnecessary force can act on the upper mask member.

Meanwhile, in the case where the frame partially or perfectly covers some or all of the dummy openings, it is preferred to design based on the aforesaid same concept as employed for letting the lower mask member cover the dummy openings.

For achieving a good pattern precision, it is preferred to use a mask member in which an area corresponding to 90% or more, preferably an area corresponding to 95% or more of the deposition mask utilization area consists of the effective openings and the dummy openings. Further, it is preferred that the ratio of the average area of effective openings (area of all effective openings/number of effective openings) and the average area of dummy openings (area of all dummy openings/number of dummy openings) (hereinafter the ratio is called the opening ratio) is in a range from 50 to 200%. A more preferred range is from 80 to 125%. If openings as wide as possible are formed in the deposition mask utilization area and the opening ratio is made closer to 100%, then the expansion and contraction of the mask member as tensioned can be easily calculated, and furthermore shape integrity, the precision of fixing to the frame and the precision of patterning can be improved.

In the case of the deposition masks exemplified in FIGS. 6 and 7, the dummy openings are partially covered and hidden by another mask member (lower mask member). Since the lower mask member is used to merely limit the luminescent area, the lower mask member is not required to assure the level of positional precision that is needed to the pixels advantageously. That is, even in the case where the dummy openings are partially covered and are partially not covered, no problem arises, since the dummy pixels formed by using said dummy openings are not used as luminescent pixels.

A particular example of the method for manufacturing an organic electroluminescent device is described below, but this invention is not limited thereto or thereby.

A transparent substrate with a transparent electrode film of indium tin oxide (ITO) or the like formed on it is processed by photolithography to form a pattern of plural striped first electrodes disposed at certain intervals.

The organic electroluminescent device of this invention can also have an insulation layer formed to partially cover the first electrodes. As the material of the insulation layer, any of various inorganic and organic materials can be used. The inorganic materials include oxide materials such as silicon oxide, manganese oxide, vanadium oxide, titanium oxide and chromium oxide, semiconductor materials such as silicon and gallium arsenide, glass materials, ceramic materials, etc., and the organic materials include polymer materials such as polyvinyl materials, polyimide materials, polystyrene materials, novolak materials and silicone materials. The insulation layer can be formed by applying any of various known methods.

For the luminescent pixels of the organic electroluminescent device of this invention, thin layers including a luminescent layer composed of organic compounds are held between the first electrodes and the second electrodes. The constitution of the thin layers is not especially limited, if it includes a luminescent layer. As the thin layers, any of the following modes can be used: 1) positive hole transport layer/luminescent layer, 2) positive hole transport layer/luminescent layer/ electron transport layer, 3) luminescent layer/electron transport layer, or 4) one layer composed of a mixture consisting of some or all of the materials used in the aforesaid layers.

Among the above layers, at least the luminescent layer must be patterned. In case of a full color display, luminescent materials corresponding to the three luminescent colors having luminescent peak wavelengths in the three color regions of red (R), green (G) and blue (B) are used to form repetitive three luminescent pixels one after another as the luminescent layer. In this invention, the luminescent layer has a striped pattern. The striped pattern in this case includes a mode in which respective stripes are formed as continuous straight lines and another mode in which intermittent stripes are arranged as straight lines. If intermittent stripes are arranged like this, a precise pattern with a good positional precision and adhesion can be obtained. In this case, it is preferred that the stripes of the luminescent layer pattern are disposed at the same pitch as that of pixels or at integer times the pitch of pixels.

After said thin layers have been formed, the second electrodes are formed. In the case of passive matrix system, plural striped second electrodes are formed at certain intervals on the thin layers in conformity with a predetermined pattern to cross the first electrodes. On the other hand, in the case of active matrix system, the second electrodes are often formed on the entire luminescent area. Since the second electrodes are required to function as cathodes that allow efficient injection of electrons, they are often made of a metallic material, considering the stability of electrodes.

After the second electrodes have been formed in conformity with a predetermined pattern, sealing process is carried out, and a drive circuit is connected to obtain an organic electroluminescent device. Meanwhile, opaque first electrodes and transparent second electrodes can also be used to take out light from the top surfaces of the pixels. Further, it is also allowed to use cathodes as the first electrodes and anodes as the second electrodes.

Moreover, it is preferred in view of cost of mass production that n (n is an integer of 2 or more) luminescent areas are processed on one substrate and that the substrate is cut into n pieces, since the productivity can be enhanced.

In the organic electroluminescent device of this invention, since the luminescent layer can be highly precisely patterned, the pitch of the pixel sets, each set consisting of one each luminescent pixel of respective colors, can be 500 µm or less, preferably 400 µm or less in both lengthwise and crosswise directions.

EXAMPLES

This invention is described below in reference to examples and comparative examples, but is not limited thereto or thereby.

Example 1

A 1.1 mm thick alkali-free glass substrate with a 130 nm thick ITO (indium tin oxide) transparent electrode film formed by sputtering on the surface of the glass substrate was cut to a size of 120×100 mm. The ITO substrate was coated with a photoresist, and the laminate was exposed and developed for patterning by ordinary photolithography. The unnecessary portions of ITO were removed by etching, and subsequently the photoresist was removed to form 90 mm long and 80 µm wide stripes from the ITO film in conformity with a predetermined pattern. The stripes were 816 first electrodes disposed at a pitch of 100 µm.

Then, a positive photoresist (OFPR-800 produced by Tokyo Ohka Kogyo Co., Ltd.) was applied to have a thickness of 3 μm by spin coating on the substrate with the first electrodes formed on it. The coating film formed of the photoresist was exposed pattern-wise through a photo mask and developed to be patterned. The development was followed by curing at 180° C. Thus, the unnecessary portions of the insulation layer were removed to form 235 μm long and 70 μm wide openings of the insulation layer on the striped first electrodes: 200 such openings were formed in the lengthwise direction at a pitch of 300 μm and 816 such openings were formed in the crosswise direction at a pitch of 100 μm. The shape of cross-section at the edge portions of the insulation layer was forward-tapered. The substrate with the insulation layer formed was dehydrated in an atmosphere of 80° C. and 10 Pa reduced pressure for 20 minutes.

Thin layers including a luminescent layer were formed by vacuum deposition with resistance wire heating. Meanwhile, the degree of vacuum during deposition was less than $2 \times 10^{-4}$ Pa, and the substrate was rotated relatively to the deposition source during deposition. At first, copper phthalocyanine was deposited by 15 nm and bis(N-ethylcarbazole) was deposited by 60 nm respectively on the entire surface of the luminescent area, to form a positive hole transport layer.

A deposition mask with an opening area having arranged openings is used as the deposition mask to form the luminescent layer. The mask member had an overall size of 120×84 mm and a thickness of 25 μm, and also had an opening area in which 278 openings with a length of 61.77 mm and a width of 100 μm are arranged in the crosswise direction at a pitch of 300 μm. For the respective openings, 205 reinforcing wires with a width of 30 μm were installed at a pitch of 300 μm. That is, the number of the openings formed by the reinforcing wires in the lengthwise direction was 206, and among the openings, 200 openings were effective openings. The size of one each opening formed by the reinforcing wires was 270 μm in length and 100 μm in width. The mask member was fixed to a 4 mm wide stainless steel frame with an overall size equal to that of the mask member.

The deposition mask for the luminescent layer was placed in front of the substrate, and the deposition mask and the substrate were kept in contact with each other. Behind the substrate, a ferrite magnetic shell (YBM-1B produced by Hitachi Metals, Ltd.) was placed. In this case, the deposition mask and the substrate were aligned to ensure that the openings of the insulation layer and the effective openings of the deposition mask overlay on each other and that three lines of dummy openings were positioned outside each of the four sides of the luminescent area. The deposition mask was prevented from being flawed, since it contacted the thick insulation layer and did not contact the positive hole transport layer formed before.

In this state, 8-hydroxyquinoline-aluminum complex ($Alq_3$) doped with 0.3 wt % of 1,3,5,7,8-pentamethyl-4,4-difluoro-4-bora-3a,4a-diaza-s-indacene (PM546) was deposited by 21 nm, to form green luminescent pixels in conformity with the predetermined pattern.

Then, the deposition mask was shifted by 1 pitch rightward, and $Alq_3$ doped with 1 wt % of 4-(dicyanomethylene)-2-methyl-6-(julolidylstyryl)pyran (DCJT) was deposited by 15 nm, to form red luminescent pixels in conformity with the predetermined pattern.

Further, the deposition mask was shifted by 2 pitches leftward, and 4,4'-bis(2,2'-diphenylvinyl)diphenyl (DPVBi) was deposited by 20 nm, to form blue luminescent pixels in conformity with the predetermined pattern. The respective luminescent pixels of green, red and blue were disposed for every three striped first electrodes, to perfectly cover the exposed portions of the first electrodes. Further, dummy pixels composed of the same organic compounds as used for forming the luminescent layer, which were not used as luminescent pixels, were disposed simultaneously: three each at top and bottom and nine each at left and right.

Then, DPVBi was deposited by 35 nm and $Alq_3$ was deposited by 10 nm respectively over the entire surface of the luminescent area. Subsequently, the thin layers were exposed to lithium vapor, to be doped with it (equivalent to the amount of 0.5 nm in thickness).

A deposition mask structured to have a gap between the surface of the mask member to be kept in contact with the substrate and the reinforcing wires was used for forming the second electrodes in conformity with a predetermined pattern. The mask member had an overall size of 120×84 mm and a thickness of 100 μm, and also had 200 striped openings with a length of 100 mm and a width of 250 μm arranged at a pitch of 300 μm. On the mask member, formed were 40 μm wide and 35 μm thick reinforcing mesh wires having regular hexagonal pattern with a distance of 200 μm kept between respectively two opposite sides. The height of the gap was 100 μm, being equal to the thickness of the mask member. The mask member was fixed to a 4 mm wide stainless steel frame with an overall size equal to that of the mask member.

The second electrodes were formed by vacuum deposition with resistance wire heating. Meanwhile, the degree of vacuum during deposition was less than $3 \times 10^{-4}$ Pa, and the substrate was rotated relatively to two deposition sources during deposition. As in patterning the luminescent layer, the deposition mask for the second electrodes was placed in front of the substrate, and the deposition mask and the substrate were kept in contact with each other. A magnet was placed behind the substrate. In this case, the deposition mask and the substrate were aligned to ensure that the openings of the insulation layer and the effective openings of the deposition mask overlay on each other. In this state, aluminum was deposited to have a thickness of 200 nm, for forming the second electrodes in conformity with the predetermined pattern. The second electrodes were disposed as stripes to cross the first electrodes in conformity with the predetermined pattern.

The substrate was taken out of the deposition apparatus and kept in an atmosphere of reduced pressure using a rotary pump for 20 minutes, and subsequently moved into an argon atmosphere of dew point of minus 90 degrees Celsius or less. In the low humidity atmosphere, the substrate and a sealing glass sheet were stuck to each other using a curable epoxy resin, for sealing.

In this way, prepared was a passive matrix color organic electroluminescent device having green luminescent pixels, red luminescent pixels and blue luminescent pixels formed according to the predetermined pattern on the 816 striped ITO first electrodes with a width of 80 μm formed at a pitch of 100 μm and also having 200 striped second electrodes with a width of 250 μm formed at a pitch of 300 μm to cross the first electrodes. Since one each luminescent pixel of red, green and blue, i.e., total three luminescent pixels form one pixel set, this luminescent device has 272×200 pixel sets at a pitch of 300 μm.

This organic electroluminescent device was driven by line sequential drive, and good display characteristics could be obtained. Further, through a microscope observation to the luminescent pixels, it was confirmed that the mixing between adjacent pixels did not occur and that a good luminescent layer pattern could be formed over the entire surface of the luminescent area.

Example 2

Figure 10:
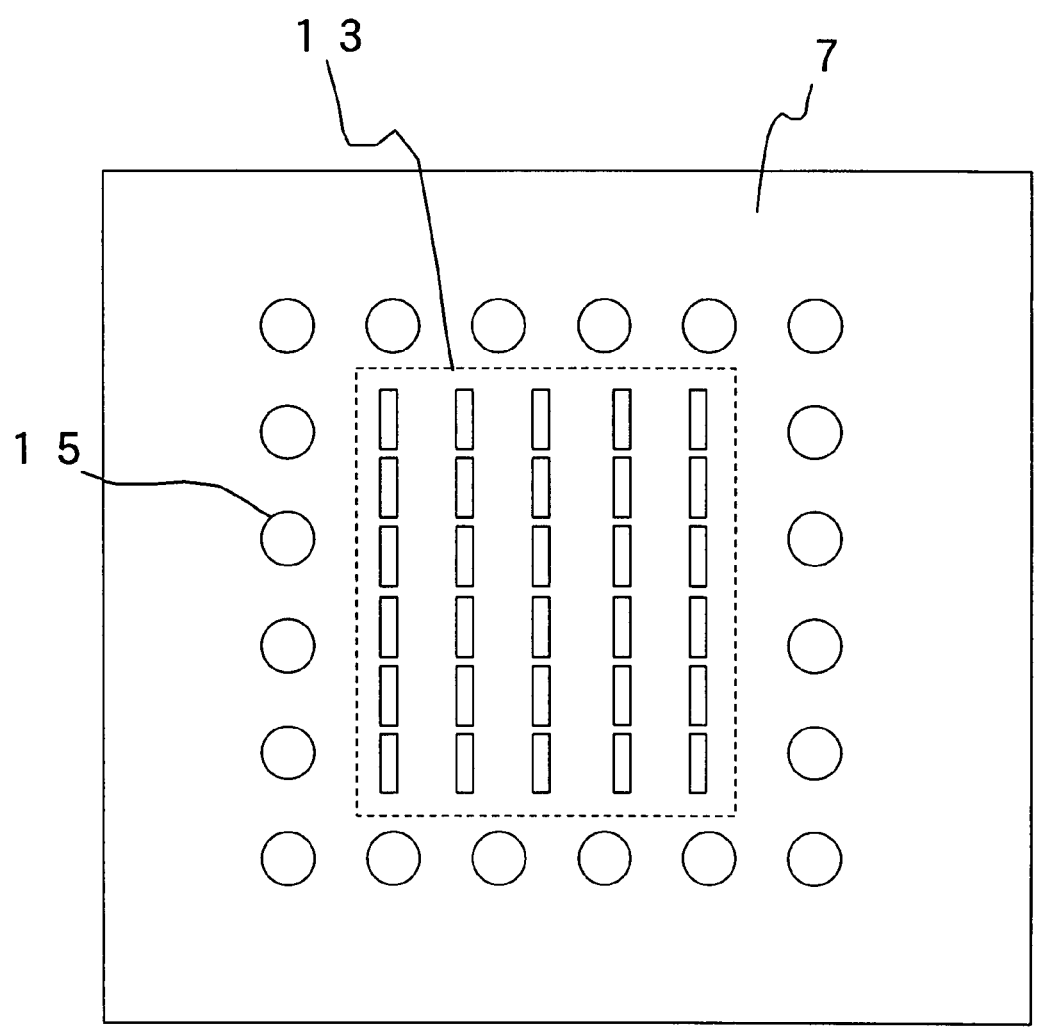
FIG. 10 is a plan view showing another example of the deposition mask having dummy openings.

An organic electroluminescent device was prepared as described in Example 1, except that the deposition mask for the luminescent layer had a effective area consisting of 200 openings in the lengthwise direction and 272 openings in the crosswise direction and that circular dummy openings with a diameter of 200 μm were arranged at a pitch of 400 μm in an area of 3 mm around the effective opening area, as shown in FIG. 10.

The organic electroluminescent device was driven by line sequential drive, and good display characteristics could be obtained. Further, through a microscope observation to the luminescent pixels, it was confirmed that mixing between adjacent pixels did not occur and that a good luminescent layer pattern could be formed over the entire surface of the luminescent area.

Example 3

A 1.1 mm thick alkali-free glass substrate with a 130 nm thick ITO transparent electrode film formed by sputtering on the surface of the glass substrate was cut to a size of 120×100 mm. The ITO substrate was coated with a photoresist, and the laminate was exposed and developed by ordinary photolithography for patterning. The unnecessary portions of ITO were removed by etching, and subsequently the photoresist was removed to form 90 mm long and 160 μm wide stripes from the ITO film in conformity with a predetermined pattern. Four hundred and eight striped first electrodes were disposed at a pitch of 200 μm.

Then, a positive photoresist (OFPR-800 produced by Tokyo Ohka Kogyo Co., Ltd.) was applied to have a thickness of 3 μm by spin coating on the substrate having the first electrodes formed on it. The coating film formed of the photoresist was exposed pattern-wise through a photo mask and developed to be patterned. The development was followed by curing at 180° C. Thus, the unnecessary portions of the insulation layer were removed to form 470 μm long and 140 μm wide insulation layer openings on the striped first electrodes: One hundred such openings were formed at a pitch of 600 μm in the lengthwise direction and 408 such openings were formed at a pitch of 200 μm in the crosswise direction. The shape of cross-section at the edge portions of the insulation layer was forward-tapered. The substrate with the insulation layer formed was dehydrated in an atmosphere of 80° C. and 10 Pa reduced pressure for 20 minutes.

Thin layers including a luminescent layer were formed by vacuum deposition with resistance wire heating. Meanwhile, the degree of vacuum during deposition was less than $2\times10^{-4}$ Pa, and the substrate was rotated relatively to the deposition source during deposition. At first, copper phthalocyanine was deposited by 15 nm and bis(N-ethylcarbazole) was deposited by 60 nm respectively over the entire surface of the luminescent area, to form a positive hole transport layer.

For patterning the luminescent layer, a deposition mask having an opening area with openings arranged in it was used. The mask member had an overall size of 120×84 mm and a thickness of 25 μm, and also had an opening area with 142 openings with a length of 63.54 mm and a width of 200 μm arranged at a pitch of 600 μm in the crosswise direction. For the respective openings, 105 reinforcing wires with a width of 60 μm were installed at a pitch of 600 μm. That is, the number of the openings formed by the reinforcing wires was 106 in the lengthwise direction, and among them, 100 openings were effective openings. The size of each one opening formed by the reinforcing wires was 540 μm in length and 200 μm in width. The mask member was fixed to a 4 mm wide stainless steel frame with an overall size equal to that of the mask member.

The deposition mask for the luminescent layer was placed in front of the substrate, and the deposition mask and the substrate were kept in contact with each other. Behind the substrate, a ferrite magnetic shell (YBM-1B produced by Hitachi Metals, Ltd.) was placed. In this case, the deposition mask and the substrate were aligned to ensure that the openings of the insulation layer and the effective openings of the deposition mask overlay on each other and that three lines of dummy openings were positioned outside each of the four sides of the luminescent area. The deposition mask was prevented from being flawed, since it contacted the thick insulation layer and did not contact the positive hole transport layer formed before.

In this state, 8-hydroxyquinoline-aluminum complex ($Alq_3$) doped with 0.3 wt % of 1,3,5,7,8-pentamethyl-4,4-difluoro-4-bora-3a,4a-diaza-s-indacene (PM546) was deposited by 21 nm for forming green luminescent pixels in conformity with the predetermined pattern.

Then, the deposition mask was shifted by 1 pitch rightward, and $Alq_3$ doped with 1 wt % of 4-(dicyanomethylene)-2-methyl-6-(julolidylstyryl)pyran (DCJT) was deposited by 15 nm for forming red luminescent pixels in conformity with the predetermined pattern.

Further, the deposition mask was shifted by 2 pitches leftward, and 4,4'-bis(2,2'-diphenylvinyl)diphenyl (DPVBi) was deposited by 20 nm for forming blue luminescent pixels in conformity with the predetermined pattern. The respective luminescent pixels of green, red and blue were disposed for every three striped first electrodes and perfectly covered the exposed portions of the first electrodes. Further, dummy pixels composed of the same organic compounds as those used for forming the luminescent layer, which were not used as luminescent pixels, were disposed simultaneously: three each at top and bottom and nine each at left and right.

Then, DPVBi was deposited by 35 nm and $Alq_3$ was deposited by 10 nm respectively over the entire surface of the luminescent area. Subsequently, the thin layers were exposed to lithium vapor, to be doped with it (equivalent to the amount of 0.5 nm in thickness).

A deposition mask structured to have a gap between the surface of the mask member to be kept in contact with the substrate and the reinforcing wires was used for patterning the second electrodes. The mask member had an overall size of 120×84 mm and a thickness of 100 μm, and also had 100 striped openings with a length of 100 mm and a width of 500 μm arranged at a pitch of 600 μm. On the mask member, formed were 40 μm wide and 35 μm thick reinforcing mesh wires having regular hexagonal pattern with a distance of 200 μm kept between respectively two opposite sides. The height of the gap was 100 μm, being equal to the thickness of the mask member. The mask member was fixed to a 4 mm wide stainless steel frame with an overall size equal to that of the mask member.

The second electrodes were formed by vacuum deposition with resistance wire heating. Meanwhile, the degree of vacuum during deposition was less than $3\times10^{-4}$ Pa, and the substrate was rotated relatively to two deposition sources during deposition. As in patterning the luminescent layer, the deposition mask for the second electrodes was placed in front of the substrate and the deposition mask and the substrate were kept in contact with each other. A magnetic was placed behind the substrate. In this case, the deposition mask and the substrate were aligned to ensure that the openings of the insulation layer and the effective openings of the deposition mask overlay on each other. In this state, aluminum was deposited to have a thickness of 200 nm, to form the second electrodes in conformity with a predetermined pattern. The second electrodes were disposed as stripes to cross the first electrodes in conformity with the pattern.

The substrate was taken out of the deposition apparatus and kept in an atmosphere of reduced pressure using a rotary pump for 20 minutes, and subsequently moved into an argon atmosphere of dew point of minus 90° C. or less. In the low humidity atmosphere, the substrate and a sealing glass sheet were stuck to each other using a curable epoxy resin, for sealing.

In this way, prepared was a passive matrix color organic electroluminescent device having green luminescent pixels, red luminescent pixels and blue luminescent pixels formed according to the predetermined pattern on the 408 striped first electrodes with a width of 160 µm formed at a pitch of 200 µm and also having 100 striped second electrodes with a width of 500 µm formed at a pitch of 600 µm to cross the first electrodes. Since one each luminescent pixel of red, green and blue, i.e., total three luminescent pixels form one pixel set, this luminescent device has 136×100 pixel sets at a pitch of 600 µm.

This organic electroluminescent device was driven by line-sequential drive, and good display characteristics could be obtained. Further, through a microscope observation to the luminescent pixels, it was confirmed that in the outer peripheral portion of the luminescent area, the edge portions of the luminescent pixels blurred. This means that the contact between the substrate and the deposition mask was impaired, but mixing between adjacent pixels did not occur.

Example 4

A 130 nm thick ITO transparent electrode film was formed by sputtering on the surface of a 0.7 mm thick alkali-free glass substrate with an overall size of 500×400 mm. The ITO substrate was coated with a photoresist, and the laminate was exposed and developed by ordinary photolithography for patterning. The unnecessary portions of ITO were removed by etching, and subsequently the photoresist was removed to form 90 mm long and 80 µm wide stripes from the ITO film in conformity with a predetermined pattern. The glass substrate had 16 luminescent areas with a diagonal distance of 4 inches, each luminescent area having 816 striped first electrodes formed at a pitch of 100 µm. It was divided into four 200×214 mm portions, to obtain four quadruple luminescent area ITO substrates.

Then, a positive photoresist (OFPR-800 produced by Tokyo Ohka Kogyo Co., Ltd.) was applied to have a thickness of 2 µm by spin coating on the substrate having the first electrodes formed on it. Subsequently, the coating film formed of the photoresist was temporarily cured at 120° C. and exposed pattern-wise through a photo mask, then being developed to be patterned. The development was followed by curing at 230° C. Thus, the unnecessary portions of the insulation layer were removed to form 235 µm long and 70 µm wide openings of the insulation layer on the striped first electrodes: Two hundred such openings were formed at a pitch of 300 µm in the lengthwise direction and 816 such openings were formed at a pitch of 100 µm in the crosswise direction. The shape of cross-section at the edge portions of the insulation layer was forward-tapered. The substrate having the insulation layer formed was dehydrated in an atmosphere of 80° C. and 10 Pa reduced pressure for 20 minutes.

Thin layers including a luminescent layer were formed by vacuum deposition with resistance wire heating. Meanwhile, the degree of vacuum during deposition was less than $2\times10^{-4}$ Pa, and the substrate was rotated relatively to the deposition source during deposition. At first, copper phthalocyanine was deposited by 15 nm and bis(N-ethylcarbazole) was deposited by 60 nm respectively on the entire surface of each luminescent area, to form a positive hole transport layer.

As the deposition mask for the luminescent layer, a deposition mask with four opening areas having openings arranged in them was used. The mask member had an overall size of 200×214 mm and a thickness of 25 µm, and also had four opening areas, each area having 278 openings with a length of 61.77 mm and a width of 100 µm formed at a pitch of 300 µm in the crosswise direction. Each opening area in the mask member is disposed so as to correspond to the ITO pattern of the quadruple luminescent area ITO substrate prepared before. For the respective openings, 205 reinforcing wires with a width of 30 µm were installed at a pitch of 300 µm. That is, the number of openings of one opening area formed by the reinforcing wires was 206 in the lengthwise direction, and among them, 200 openings were effective openings. The size of each one opening formed by the reinforcing wires was 270 µm in length and 100 µm in width. The mask member was fixed to a super invar steel frame having a 163×201 mm opening, and the deposition mask utilization area was 163×201 mm.

The deposition mask for the luminescent layer was placed in front of the substrate, and the deposition mask and the substrate were kept in contact with each other. Behind the substrate, a ferrite magnetic shell (YBM-1B produced by Hitachi Metals, Ltd.) was placed. In this case, the deposition mask and the substrate were aligned to ensure that the openings of the insulation layer and the effective openings of the deposition mask overlay on each other and that three lines of each dummy openings were positioned outside each of the four sides of each luminescent area. The deposition mask was prevented from being flawed, since the deposition mask contacted the thick insulation layer and did not contact the positive hole transport layer formed before.

In this state, 8-hydroxyquinoline-aluminum complex ($Alq_3$) doped with 0.3 wt % of 1,3,5,7,8-pentamethyl-4,4-difluoro-4-bora-3a,4a-diaza-s-indacene (PM546) was deposited by 21 nm, to form green luminescent pixels in conformity with the predetermined pattern.

Then, the deposition mask was shifted by 1 pitch rightward, and $Alq_3$ doped with 1 wt % of 4-(dicyanomethylene)-2-methyl-6-(julolidylstyryl)pyran (DCJT) was deposited by 15 nm, to form red luminescent pixels in conformity with the predetermined pattern.

Further, the deposition mask was shifted by 2 pitches leftward, and 4,4'-bis(2,2'-diphenylvinyl)diphenyl (DPVBi) was deposited by 20 nm, to form blue luminescent pixels in conformity with the predetermined pattern. The respective luminescent pixels of green, red and blue were disposed for every three striped first electrodes, to perfectly cover the exposed portions of the first electrodes. Further, dummy pixels composed of the same organic compounds as those used for forming the luminescent layer, which were not used as luminescent pixels, were disposed simultaneously: three each at top and bottom and nine each at left and right.

Then, DPVBi was deposited by 35 nm and $Alq_3$ was deposited by 10 nm respectively over the entire surface of each luminescent area. Subsequently, the thin layers were exposed to lithium vapor, to be doped with it (equivalent to the amount of 0.5 nm in thickness).

A deposition mask structured to have a gap between the surface of the mask member to be kept in contact with the substrate and the reinforcing wires was used for forming the second electrodes inconformity with a predetermined pattern. The mask member had an overall size of 200×214 mm and had a thickness of 100 μm, and also had four opening areas, each area having 200 striped openings with a length of 100 mm and a width of 250 μm arranged at a pitch of 300 μm, disposed in the position corresponding to the ITO substrate. On the mask member, formed were 40 μm wide and 35 μm thick reinforcing mesh wires having regular hexagonal pattern with a distance of 200 μm kept between respectively two opposite sides. The height of the gap was 100 μm, being equal to the thickness of the mask member. The mask member was fixed to a super invar steel frame having a 163×201 mm opening, and the deposition mask utilization area was 163× 201 mm.

The second electrodes were formed by vacuum deposition with resistance wire heating. Meanwhile, the degree of vacuum during deposition was less than $3 \times 10^{-4}$ Pa, and the substrate was rotated relatively to two deposition sources during deposition. As in patterning the luminescent layer, the deposition mask for the second electrodes was placed in front of the substrate, and the deposition mask and the substrate were kept in contact with each other. A magnet was placed behind the substrate. In this case, the deposition mask and the substrate were aligned to ensure that the openings of the insulation layer and the effective openings of the deposition mask overlay on each other. In this state, aluminum was deposited to have a thickness of 300 nm, for forming the second electrodes in conformity with a predetermined pattern. The second electrodes were disposed as stripes to cross the first electrodes in conformity with the predetermined pattern.

The substrate was taken out of the deposition apparatus and kept in an atmosphere of reduced pressure using a rotary pump for 20 minutes, and subsequently moved into an argon atmosphere of dew point of minus 90° C. or less. In the low humidity atmosphere, the substrate and a sealing glass sheet were stuck to each other using a curable epoxy resin, for sealing.

In this way, prepared was a set of four organic electroluminescent devices, each device having green luminescent pixels, red luminescent pixels and blue luminescent pixels formed according to the predetermined pattern on the 816 striped ITO first electrodes with a width of 80 μm formed at a pitch of 100 μm and also having 200 striped second electrodes with a width of 250 μm formed at a pitch of 300 μm to cross the first electrodes. The sealed glass substrate and the sealing glass sheet set were divided into four portions, to obtain four passive matrix color organic electroluminescent devices respectively with a diagonal distance of 4 inches. Since one each luminescent pixel of red, green and blue, i.e., total three luminescent pixels form one pixel set, each of the electroluminescent devices had 272×200 pixel sets at a pitch of 300 μm.

The respective organic electroluminescent devices were driven by line sequential drive, and good display characteristics could be obtained. Further, through a microscope observation to the luminescent pixels, and it was confirmed that mixing between adjacent pixels did not occur and that good luminescent layer patterns were formed over the entire surfaces of the respective luminescent areas. The patterning precision of the luminescent layer was within ±10 μm.

Example 5

A mask member having an overall size of 200×214 mm and having 270 μm long and 100 μm wide openings arranged at a pitch of 300 μm in both the lengthwise and crosswise directions on the entire surface of the deposition mask utilization area (more than 90%) was fixed on the top surface of the same frame as used in Example 4. Further, a mask member having an overall size of 162×200 mm and having four openings respectively rather larger than the luminescent area was placed just beneath said deposition mask on the deposition source side, and fixed in the frame. The mask members were not bonded to each other. In this way, the deposition mask for the luminescent layer as shown in FIG. 7 was prepared. Organic electroluminescent devices were prepared as described for Example 1, except the above matters.

The respective organic electroluminescent devices were driven by line sequential drive, and good display characteristics could be obtained. Further, through a microscope observation to the luminescent pixels, and it was confirmed that mixing between adjacent pixels did not occur and that good luminescent layer patterns could be formed over the entire surfaces of the respective luminescent areas. Furthermore, the dummy pixels composed of the same organic compounds as those used for forming the luminescent layer, which were not used as luminescent pixels, were disposed: one each at top and bottom and three each at left and right. Some of them were incompletely formed in shape. The patterning precision of the luminescent layer was within ±7 μm. Since openings were arranged on the entire surface of the deposition mask utilization area, the bending of the mask was decreased and further enhanced patterning precision was achieved.

Example 6

A mask member having an overall size of 200×214 mm and having 270 μm long and 100 μm wide openings arranged at a pitch of 300 μm in both the lengthwise and crosswise directions over the entire surface of the deposition mask utilization area (more than 90%) was used as the deposition mask for the luminescent layer, and it was stuck to a super invar steel frame having crossed bars. In this case, the bars were also bonded to the deposition mask member. In this way, a deposition mask for the luminescent layer as shown in FIG. 11 was prepared. Organic electroluminescent devices were prepared as described for Example 4, except the above matters. Since crossed bars were added to the frame, the deposition-mask could form four luminescent layer patterns respectively rather larger than the corresponding luminescent area.

The respective organic electroluminescent devices were driven by line sequential drive, and good display characteristics could be obtained. Further, through a microscope observation to the luminescent pixels, and it was confirmed that mixing between adjacent pixels did not occur and that good luminescent layer patterns could be formed over the entire surfaces of the respective luminescent areas. Further, dummy pixels composed of the same organic compounds as those used for forming the luminescent layer, which were not used as luminescent pixels, were disposed: one each at top and bottom and three each at left and right. Some of them were incompletely formed in shape. The patterning precision of the luminescent layer was within ±5 μm. Since the addition of bars reduced the frame deformation, further enhanced patterning precision was achieved.

Comparative Example 1

An organic electroluminescent device was prepared as described for Example 1, except that the deposition mask for the luminescent layer had openings arranged like matrix of 200 in the lengthwise direction and 272 in the crosswise direction in the end. That is, the deposition mask for the luminescent layer had no dummy openings, and prepared was a passive matrix color organic electroluminescent device in which the luminescent area with the first electrodes and the second electrodes overlying on each other corresponded to the effective opening area of the deposition mask for the luminescent layer.

The organic electroluminescent device was driven by line sequential drive, and mixing between adjacent pixels was observed in the outer peripheral portion of the luminescent area. The reason was that the bending occurring at the boundary portion between the mask area and the opening area of the mask member impaired the adhesion between the substrate and the deposition mask.

This invention can be applied to the production of an organic electroluminescent device that is one of plane panel displays desired to have a higher precision.

The invention claimed is:

1. A deposition mask for depositing a luminescent layer of an organic electroluminescent device, comprising a first mask member and a second mask member,
   wherein the first mask member has effective openings for forming portions of the luminescent layer used as luminescent pixels and dummy openings not used for forming the luminescent pixels and positioned around an area demarcated by outer edges of a group of the effective openings forming an effective opening area, and
   wherein some or all of the dummy openings in the first mask member are partially or fully covered and hidden by the second mask member or by the second mask member and a frame.

2. The deposition mask of claim 1, wherein an edge of an opening formed in the second mask member or frame is positioned outside the area surrounded by the dummy openings of the first mask member and inside an area surrounded by a line drawn at a distance of 500 μm from outer edges of the effective opening area.

3. The deposition mask of claim 1, or 2, wherein the first mask member is fixed to a frame; wherein a deposition mask utilization area occupying an area of more than 90% of the portion of the first mask member other than the portion used for fixing to the frame is occupied with the effective openings and the dummy openings; and an opening ratio of the average area of the effective openings to the average area of the dummy openings is 50 to 200%.

4. A method for manufacturing an organic electroluminescent device having luminescent pixels of two or more colors, comprising
   placing the deposition mask of claim 1 in contact with or near an object for deposition for pixels of at least one color, and
   depositing the luminescent organic compound through said mask to form a luminescent layer on a substrate.

5. An organic electroluminescent device manufactured utilizing the deposition mask of claim 1, comprising thin layers including a luminescent layer composed of organic compounds disposed between first electrodes and second electrodes forming luminescent pixels of two or more colors disposed in a luminescent area at a predetermined pitch over a substrate, and
   one or more dummy pixels that are composed of the same organic compounds as those used for forming the luminescent layer but are not used as luminescent pixels are formed in an area of the device other than the luminescent area,
   wherein the luminescent layer is formed having a pattern of stripes; and
   wherein the luminescent pixels are disposed in such a manner that respective colors are disposed alternately in one direction.

6. The organic electroluminescent device of claim 5, wherein the dummy pixels are formed at a distance of 500 μm or less from an outer edge of the luminescent area.

7. The organic electroluminescent device of claim 5 or 6, wherein the stripes of the luminescent layer pattern in the luminescent area are disposed at the same pitch as that of said luminescent pixels or at integer multiples of the pitch of said pixels.

8. The organic electroluminescent device of claim 5 or 6, wherein the pitch of the pixel sets, each set consisting of one luminescent pixel each of respective colors, is 500 μm or less in both the lengthwise and crosswise directions.

* * * * *